United States Patent [19]

Fujimoto et al.

[11] Patent Number: 5,049,596
[45] Date of Patent: Sep. 17, 1991

[54] EPOXY RESIN BASED POWDER COATING COMPOSITION WITH MIXED FILLER INCLUDING MICROFINE SILICA

[75] Inventors: Yoshihisa Fujimoto, Chiba; Yoshihiro Motoki, Saitama; Kazufumi Ueji, Saitama; Kunio Imai, Saitama, all of Japan

[73] Assignee: Somar Corporation, Tokyo, Japan

[21] Appl. No.: 437,134

[22] Filed: Nov. 16, 1989

Related U.S. Application Data

[63] Continuation-in-part of Ser. No. 210,956, Jun. 24, 1988, abandoned.

[30] Foreign Application Priority Data

Jun. 25, 1987 [JP] Japan ............................ 62-158638

[51] Int. Cl.$^5$ .............................................. C08L 63/00
[52] U.S. Cl. ................................. 523/427; 523/443; 525/481; 525/482; 525/485; 525/487; 525/934
[58] Field of Search ............... 523/427, 443; 525/481, 525/482, 485, 487

[56] References Cited

U.S. PATENT DOCUMENTS 3,914,204 10/1975 Helm et al. ........................ 528/120
4,117,038 9/1978 Lehmann et al. .................. 528/120
4,720,515 1/1988 Iji et al. ............................. 523/435
4,876,324 10/1989 Nakano et al. ..................... 528/144

FOREIGN PATENT DOCUMENTS 3159422 6/1988 Japan.

*Primary Examiner*—Earl Nielsen
*Assistant Examiner*—Frederick Kearn
*Attorney, Agent, or Firm*—Sughrue, Mion, Zinn Macpeak & Seas

[57] ABSTRACT

An epoxy resin based powder coating composition which comprises: (A) 100 parts by weight of a mixed epoxy resin having a softening point of 60°-80° C. which consists of 50 to 70 wt. % of a bisphenol A expoxy resin having a number-average molecular weight of 800 to 1,800 and 30 to 50 wt. % of a cresol novolak epoxy resin; (B) 5 to 80 parts by weight of a novolak resin; (C) 0.5 to 5 parts by weight of triphenylphosphine; (D) 60 to 200 parts by weight of an inorganic powder having an average particle size of 0.5 to 75 um; and (E) 0.01 to 2 parts by weight of a microfine silica powder having an average particle size of 1 to 100 nm.

The epoxy resin based powder coating composition can be coated on electrical and electronic components at 90°-100° C. with retaining the high moisture resistance, storage stability and free-flowing properties.

11 Claims, No Drawings

EPOXY RESIN BASED POWDER COATING COMPOSITION WITH MIXED FILLER INCLUDING MICROFINE SILICA

CROSS REFERENCE TO RELATED APPLICATION

This is continuation-in-part application of Ser. No. 07/210,956 filed June 24, 1988 (abandoned).

FIELD OF THE INVENTION

The present invention relates to an epoxy resin based powder coating composition. Being coatable at low temperatures (i.e., 90°-100° C.), the composition can advantageously be used in applying coatings on film capacitors and other components of semiconductor devices.

BACKGROUND OF THE INVENTION

Powder coatings for film capacitors have been known and as one example of such coatings, a composition consisting of 70 to 80% of an epoxy resin (m.p. 80°-100° C.), 20 to 30% of a curing agent (acid anhydride) and 1 to 30% of other ingredients (e.g. a filler, a flame retardant and a cure accelerator) is described in JP-A-58-194324. (The term "JP-A" as used herein means an "unexamined published Japanese patent application".) These prior art epoxy resin based powder coatings have high storage stability and exhibit good free-flowing properties during coating operations. The surfaces of a film capacitor element that is solely composed of a dielectric film (e.g. polypropylene or polyester film), electrodes on both sides of the dielectric film, and lead wires attached to them, can be coated with these powders to fabricate a highly moisture-proof film capacitor. However, when the capacitor element is heated at 120° C. during coating operations, the dielectric film is prone to thermal deformation, which results in low electrical capacitance.

The problem of thermal deformation can be solved by applying the coating powders with the capacitor element being heated at 90°-100° C. but then the powders will not be sufficiently fused to provide good adhesion to the surfaces of the capacitor element. In addition, the applied coating will not cure fast enough to be satisfactory for practical purposes. It has therefore been desired to develop a powder coating that retains the high moisture resistance, storage stability and free-flowing properties of the prior art products and which yet can be applied at lower temperatures of 90°-100° C.

SUMMARY OF THE INVENTION

An object, therefore, of the present invention is to provide a powder coating that exhibits comparable performance to the prior art products in application of coatings on electrical and electronic components with respect to moisture resistance, storage stability, free-flowing property and cure rate, and which yet is suitable for low-temperature (90°-100° C.) coating of film capacitors and other components that have comparatively small heat capacity and which are prone to thermal deformation.

This object of the present invention can be attained by an epoxy resin based powder coating composition which comprises: (A) 100 parts by weight of a mixed epoxy resin having a softening point of 60°-80° C. which consists of 50 to 70 wt % of a bisphenol A type epoxy resin having a number-average molecular weight of 800 to 1,800 and 30 to 50 wt % of a cresol novolak epoxy resin; (B) 5 to 80 parts by weight of a novolak resin; (C) 0.5 to 5 parts by weight of triphenylphosphine; (D) 60 to 200 parts by weight of an inorganic powder having an average particle size of 0.5 to 75 μm; and (E) 0.01 to 2 parts by weight of a microfine silica powder having an average particle size of 1 to 100 nm.

DETAILED DESCRIPTION OF THE INVENTION

The epoxy resin used as the base component of the powder coating of the present invention is a mixed epoxy resin having a softening point of 60°-80° C. and which consists of 50 to 70 wt % of a bisphenol A epoxy resin having a number-average molecular weight of 800 to 1,800 and 30 to 50 wt % of a cresol novolak epoxy resin. The bisphenol A epoxy resin has a number-average molecular weight of 800 to 1,800, preferably 900 to 1,400, more preferably 950 to 1,100. If the average molecular weight of the bisphenol A epoxy resin is less than 800, the coating powder obtained will suffer from a "blocking" problem which reduces its flowability during coating operations. If the average molecular weight of the bisphenol A epoxy resin exceeds 1,800, the moisture resistance of the coated electric or electronic components and other substrates will be decreased. The cresol novolak epoxy resin generally has a softening point of 60°-100° C. and it is preferred to use cresol novolak epoxy resins having softening points in the range of 65°-80° C. A mixture of the above-described bisphenol A epoxy resin and cresol novolak epoxy resin is used as the base epoxy resin component of the powder coating of the present invention. The content of the bisphenol A epoxy resin in this mixed epoxy resin ranges from 50 to 70 wt %. If the bisphenol A type epoxy resin content is less than 50 wt % of the mixed epoxy resin, the adhesion of the coating formed of the resulting powder will decrease with time. If the bisphenol A epoxy resin content exceeds 70 wt % of the mixed epoxy resin, the moisture resistance of the coated electric or electronic component or other substrates will decrease. The cresol novolak epoxy resin is incorporated in an amount of 30 to 50 wt % of the mixed epoxy resin. If the content of the cresol novolak epoxy resin exceeds 50 wt % of the mixed epoxy resin, the storage stability of the resulting powder coating will decrease. If the content of the cresol novolak epoxy resin is less than 30 wt % of the mixed epoxy resin, not only the cure rate of the applied coating but also the moisture resistance of the coated electric or electronic component or other substrates will decrease. The mixed epoxy resin has a softening point of 60°-80° C., preferably 62°-75° C. If the softening point of the mixed epoxy resin is less than 60° C., the finished powder coating will have only poor free-flowing properties. If the softening point of the mixed epoxy resin exceeds 80° C., the resulting powder coating will not adhere strongly to substrates and a desired film thickness is not attainable if the powder is applied at low temperatures (90°-100° C.) to film capacitors and other components having small heat capacity.

The powder coating of the present invention has a novolak resin incorporated as an epoxy resin curing agent. The novolak resin is produced by synthesizing a phenolic compound and formaldehyde, and in the present invention, the novolak resin is preferably produced by synthesizing phenol and/or alkylphenol (e.g., cresol, tert-butyl phenol) and formaldehyde. The novolak resin produced by synthesizing phenol and formaldehyde (phenol novolak resin) is particularly preferred. The softening point of the novolak resin is generally in the range of 70°–120° C., preferably 70°–100° C. The novolak resin is used in an amount of 5 to 80 parts by weight per 100 parts by weight of the epoxy resin. If this range is not observed, the moisture resistance of the coated electric or electronic component and other substrates will decrease with time. In applications where particularly high moisture resistance is required, the novolak resin is preferably used in amounts ranging from 10 to 50 parts by weight.

The powder coating of the present invention contains triphenylphosphine as a curing catalyst that is incorporated in an amount of 0.5 to 5 parts by weight per 100 parts by weight of the epoxy resin. If the amount of the triphenylphosphine is less than 0.5 parts by weight, the cure rate is undesirably low. If more than 5 parts by weight of triphenylphosphine is used, the moisture resistance of the coated electric or electronic component and other substrates will be decreased. With electric and electronic components which required particularly high moisture resistance, triphenylphosphine is preferably used in an amount of 1.0 to 3 parts by weight.

The powder coating of the present invention also contains an inorganic powder. While conventional inorganic powders are usable such as silica, calcium carbonate, dolomite [Ca.Mg(CO$_3$)$_2$], calcium silicate, alumina, clay, mica, talc and glass fiber powder, silica powder is preferably used if one wants to produce a coating powder that is suitable for fabricating highly moisture-proof electrical and electronic components. The inorganic powder to be used in the present invention has an average particle size of 0.5 to 75 μm, preferably 3 to 50 μm. The inorganic powder is used in an amount of 60 to 200 parts by weight, preferably 70 to 90 parts by weight, per 100 parts by weight of the epoxy resin. If less than 60 parts by weight of the inorganic powder is used, the moisture resistance of the coated electric or electronic component will decrease with time. If more than 200 parts by weight of the inorganic powder is used, the resulting coating powder will not adhere strongly to substrates during coating and a desired film thickness is not attainable.

Another essential ingredient of the powder coating of the present invention is a microfine silica powder which is to be incorporated in an amount of 0.01 to 2 parts by weight, preferably 0.3 to 2 parts by weight, per 100 parts by weight of the epoxy resin. The microfine silica powder has an average particle size of 1 to 100 nm. If the content of the microfine silica powder is less than 0.01 part by weight, the resulting coating powder will have poor free-flowing properties. If the content of the microfine silica powder exceeds 2 parts by weight, pinholes will develop in the resulting coating or it will lose gloss.

To the powder coating of the present invention, in cases where particularly high moisture resistance is required, it is preferred to add a silane coupling agent. The silane coupling agent is used in an amount of preferably 0.1 to 6 parts by weight per 100 parts by weight of the epoxy resin. Particularly preferably, the silane coupling agent is used in an amount of 0.5 to 2.0 parts by weight per 100 parts by weight of the inorganic powder to be added. The silane coupling agent may previously be coated on the surface of the inorganic powder, or may be added to the epoxy resin together with the other essential ingredients.

In addition to the essential ingredients described above, the powder coating of the present invention may have incorporated therein an appropriate amount of auxiliary components that are commonly employed in powder coatings of the type contemplated by the present invention, such as leveling agents (e.g., acrylate ester oligomers), pigments, fire retardants and a variety of cure accelerators.

The epoxy resin based powder coating of the present invention may be prepared by standard procedures; the essential and any other ingredients are mixed and either dry-blended in a kneader or melt-mixed in an extruder, with the mix being subsequently cooled to solidify the same and being finely ground into particles.

The powder coating of the present invention has the advantage that it exhibits comparable performance to the prior art products in application of coatings on electrical and electronic components with respect to moisture resistance, storage stability, free-flowing property and cure rate, and that it yet is suitable for low-temperature (90°–100° C.) coating of film capacitors and other components that have comparatively small heat capacity and which are prone to thermal deformation.

The following examples are provided for the purpose of further illustrating the present invention but are in no way to be taken as limiting.

EXAMPLES 1 TO 5 AND COMPARATIVE EXAMPLES 1 TO 4

Epoxy resin compositions were prepared according to the components (in parts by weight) noted in Table 1. Their performance was evaluated and the results are also shown in Table 1. The components listed in Table 1 have the characteristics identified below:

Epikote 1007: Bisphenol A epoxy resin (number-average molecular weight, 2,900) manufactured by Yuka-Shell Epoxy Co., Ltd.

Epikote 1004: Bisphenol A epoxy resin (number-average molecular weight, 1,600) manufactured by Yuka-Shell Epoxy Co., Ltd.

Epikote 1002: Bisphenol A epoxy resin (number-average molecular weight, 1,200) manufactured by Yuka-Shell Epoxy Co., Ltd.

Epikote 1001: Bisphenol A epoxy resin (number-average molecular weight, 900) manufactured by Yuka-Shell Epoxy Co., Ltd.

EOCN 102S: Orthocresol novolak epoxy resin (softening point, 65° C.) manufactured by Nippon Kagaku Co., Ltd.

Tamanol 754: Phenol novolak resin (softening point, 90° C.) manufactured by Arakawa Kagaku Kogyo K.K.

Tamanol 757B: Phenol/cresol copolymerized novolak resin (softening point 85° C.) manufactured by Arakawa Kagaku Kogyo K.K.

Silica: Crystalline silica (average particle size, 6 μm)

Silane coupling agent: 3-Glycidoxypropyltrimethoxysilane

Aerosil: Microfine silica powder (average particle size, ca. 7 nm) manufactured by Nippon Aerosil Co., Ltd.

The performance of the sample epoxy resin compositions as powder coatings was evaluated by the following methods in accordance with the criteria noted below.

Curability

The gel time of each sample was measured in accordance with JIS C-2104, with the heated plate held at 100° C. The curability of the sample was rated "good" when its gel time was in the range of from 200 seconds to less than 600 seconds. The curability of the sample was rated "poor" when its gel time was less than 200 seconds because the storage stability was deteriorated. Also when its gel time was 600 or more seconds, the curability of the sample was rated "poor" because it could not be cured for a short time at low temperature.

Storage Stability

Each sample was stored in an air-conditioned room for 7 days at 40° C. and at 80% RH(relative humidity). The relative value of its gel time (measured in accordance with JIS C-2104 with the heated plate held at 150° C.) was calculated, with the initial value (as measured under the same conditions as noted above) being taken as 100. The storage stability of the sample was rated "good" when the relative value of its gel time was at least 30. When the relative value was less than 30, the storage stability of the sample was rated "poor" since the appearance of film (for example, smoothness, gloss) prepared by coating the sample was poor.

Free-flowing Property

A container for a fluidized-bed coating process (200 mm × 90 mm × 130 mm) was charged with 700 g of each sample of coating powder. Air was passed substantially uniformly through the porous plate at the base of the container so that the powder would expanded in volume and fluidize. The time required for the powder to attain a maximum apparent volume and to form a stable fluidized bed was measured to give an index of the powder's free-flowing property. The air flow rate at the time when the powder was in the state of a stable fluidized bed was 10.5 liter/min at room temperature. The powder's free-flowing property was rated "good" when the measured time was no longer than 10 seconds. When the measured time was longer than 10 seconds, the fine powder was very much scattered and therefore, the powder's free flowing property was rated "poor".

Coatability of Powder

A capacitor element solely composed of a metallized polyester film and lead wires was heated at 100° C. and its surface was coated with each of the powder samples by the fluidized-bed coating process. The coatability of the powder was rated "good" when the coating obtained was free from pinholes, had high gloss and was at least 0.5 mm thick.

Moisture Resistance

A powder-coated film capacitor having an initial electrical capacitance (X) was placed in an air-conditioned room (85° C. × 95% RH) for 240 hours and its electrical capacitance (Y) was measured after this humidification test. The moisture resistance of the film capacitor was rated "good" when the value of Y/X was at least 0.95. When the value was less than 0.95, the capacitor characteristic became poor.

Level flow ratio (120° C.)

Each sample (1 g) was introduced into a mold having a 16 mm diameter and a 50 mm in depth, and then was subjected to application of pressure of 200–250 kg/cm$^2$ by a hydraulic press for about 30 seconds to mold a pellet. The pellet had a 16 mm diameter and about a 3.2 mm height.

The sample pellet was put on a glass plate (76 mm × 26 mm × 1 mm) which was level. The glass plate was put into a circulating hot air dryer (120° C.) in a level state. After ten minutes have passed, the pellet on the glass plate was took out and was cooled to a room temperature. Then, the average diameter of the pellet was measured to calculate a level flow ratio. The level flow ratio was calculated by the following equation.

$$\text{Level flow ratio (\%)} = \frac{B - A}{A} \times 100$$

A: Diameter of pellet before heating
B: Average diameter of pellet after heating The measurement of the level flow ratio was performed three times or more per the same powder sample, and the average was calculated.

The level flow ratio of the sample was rated "good" when the ratio (average) was in the range of from 5 to 25%. When the ratio was less than 5%, the sample was poor in flow upon melting and in the appearance of a film (for example, smoothness, gloss) prepared by coating it and, on the other hand, when the ratio was more than 25%, the sample also was poor since flow was caused or the edge-cover property was poor due to the large flow upon melting.

TABLE 1

|  | Example | | | | | Comparative Example | | | |
|---|---|---|---|---|---|---|---|---|---|
|  | 1 | 2 | 3 | 4 | 5 | 1 | 2 | 3 | 4 |
| Epikote 1007 | — | — | — | — | — | 20 | — | — | — |
| Epikote 1004 | — | — | — | 20 | — | — | — | — | — |
| Epikote 1002 | 30 | 30 | 30 | — | 30 | — | 40 | 20 | 30 |
| Epikote 1001 | 25 | 35 | 40 | 50 | 35 | 40 | 40 | 20 | 35 |
| EOCN 102S | 45 | 35 | 30 | 30 | 35 | 40 | 20 | 60 | 35 |
| Tamanol 754 | 15 | 15 | 50 | 15 | — | 15 | 15 | 15 | 15 |
| Tamanol 757B | — | — | — | — | 30 | — | — | — | — |
| Triphenyl-phosphine | 1 | 2 | 1.5 | 1 | 2 | 1 | 1 | 1 | 1 |
| Silica | 80 | 80 | 100 | 80 | 80 | 80 | 80 | 80 | 80 |
| Silane coupling agent | 1 | 1 | 1 | 1 | 1 | 1 | 1 | 1 | — |
| Aerosil | 0.1 | 0.1 | 0.1 | 0.1 | 0.1 | 0.1 | 0.1 | 0.1 | 0.1 |
| Curability | ○ | ○ | ○ | ○ | ○ | ○ | X | X | ○ |
| Storage stability | ○ | ○ | ○ | ○ | ○ | ○ | ○ | X | ○ |
| Free-flowing property | ○ | ○ | ○ | ○ | ○ | ○ | ○ | ○ | ○ |
| Coatability | ○ | ○ | ○ | ○ | ○ | X | ○ | ○ | ○ |

TABLE 1-continued

| | Example | | | | | Comparative Example | | | |
|---|---|---|---|---|---|---|---|---|---|
| | 1 | 2 | 3 | 4 | 5 | 1 | 2 | 3 | 4 |
| of powder Moisture resistance | ○ | ○ | ○ | ○ | ○ | X | X | ○ | X |
| Level flow ratio (120° C.) | ○ | ○ | ○ | ○ | ○ | X | ○ | ○ | ○ |

○: "good", X: "poor"

This invention has been described in detail with particular reference to preferred embodiments thereof, but it will be understood that variations and modifications can be effected within the spirit and scope of the invention.

While the invention has been described in detail and with reference to specific embodiments thereof, it will be apparent to one skilled in the art that various changes and modifications can be made therein without departing from the spirit and scope thereof.

What is claimed is:

1. An epoxy resin based powder coating composition which comprises: (A) 100 parts by weight of a mixed epoxy resin having a softening point of 60°–80° C. which consists of 50 to 70 wt % of a bisphenol A epoxy resin having a number-average molecular weight of 800 to 1,800 and 30 to 50 wt % of a cresol novolak epoxy resin; (B) 5 to 80 parts by weight of a novolak resin having a softening point of 70°–120° C.; (C) 0.5 to 5 parts by weight of triphenylphosphine; (D) 60 to 200 parts by weight of an inorganic powder having an average particle size of 0.5 to 75 μm; and (E) 0.01 to 2 parts by weight of a microfine silica powder having an average particle size of 1 to 100 nm.

2. An epoxy resin based powder coating composition as in claim 1, wherein said coating composition further comprises a silane coupling agent in an amount of 0.1 to 6 parts by weight per 100 parts by weight of said epoxy resin.

3. An epoxy resin based powder coating composition as in claim 1, wherein said novolak resin is produced by synthesizing at least one of phenol and alkylphenol and formaldehyde.

4. An epoxy resin based powder coating composition as in claim 3, wherein the alkylphenol is selected from cresol and tert-butyl phenol.

5. An epoxy resin based powder coating composition as in claim 1, wherein said novolak resin is a phenol novolak resin.

6. An epoxy resin based powder coating composition as in claim 1, wherein said bisphenol A epoxy resin has a number-average molecular weight of 950 to 1,100.

7. An epoxy resin based powder coating composition as in claim 1, wherein the content of said novolak resin is 10 to 50 parts by weight per 100 parts by weight of said epoxy resin.

8. An epoxy resin based powder coating composition as in claim 1, wherein the content of said triphenylphosphine is 1.0 to 3.0 parts by weight per 100 parts by weight of said epoxy resin.

9. An epoxy resin based powder coating composition as in claim 1, wherein said inorganic powder is selected from the group consisting of silica, calcium carbonate, dolomite, calcium silicate, alumina, clay, mica, talc and glass fiber powder.

10. An epoxy resin based powder coating composition as in claim 9, wherein said inorganic powder is silica powder.

11. An epoxy resin powder coating composition as in claim 1, wherein said novolak resin has a softening point of 70°–100° C.

* * * * *